United States Patent
Bergenek et al.

(10) Patent No.: US 10,378,711 B2
(45) Date of Patent: Aug. 13, 2019

(54) LIGHT GENERATION WITH LIGHT EMITTING DIODE AND LASER

(71) Applicant: OSRAM GmbH, Munich (DE)

(72) Inventors: Krister Bergenek, Regensburg (DE); Joerg Sorg, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/779,537

(22) PCT Filed: Nov. 3, 2016

(86) PCT No.: PCT/EP2016/076559
§ 371 (c)(1),
(2) Date: May 28, 2018

(87) PCT Pub. No.: WO2017/097504
PCT Pub. Date: Jun. 15, 2017

(65) Prior Publication Data
US 2018/0347773 A1    Dec. 6, 2018

(30) Foreign Application Priority Data
Dec. 9, 2015    (DE) .................. 10 2015 224 692

(51) Int. Cl.
*F21S 41/141*    (2018.01)
*F21S 41/14*    (2018.01)
(Continued)

(52) U.S. Cl.
CPC ............ *F21S 41/141* (2018.01); *F21S 41/14* (2018.01); *F21S 41/16* (2018.01); *F21S 41/18* (2018.01);
(Continued)

(58) Field of Classification Search
CPC ........ F21S 41/141; F21S 41/18; F21S 41/657; F21S 41/16; F21S 41/675; F21S 41/14; F21S 45/47; H01L 33/504
See application file for complete search history.

(56) References Cited

U.S. PATENT DOCUMENTS

2011/0249460 A1    10/2011 Kushimoto
2013/0020582 A1*    1/2013 Zimmerman ....... H01L 33/0075
                                                                257/76
(Continued)

FOREIGN PATENT DOCUMENTS

DE    102011088791 B3    4/2013
DE    102013226614 A1    6/2015
(Continued)

OTHER PUBLICATIONS

International Search Report based on application No. PCT/EP2016/076559 (5 pages + 2 pages English Translation) dated Jan. 30, 2017 (for reference purpose only).
German Search Report based on application No. 10 2015 224 692.2 (7 pages) dated Feb. 16, 2016 (for reference purpose only).

*Primary Examiner* — Anh T Mai
*Assistant Examiner* — Glenn D Zimmerman

(57) ABSTRACT

A light generating device, comprising: at least one light emitting diode having a semiconductor layer that emits a first primary light, and having a phosphor layer arranged on the semiconductor layer, and at least one laser for generating at least one laser beam composed of a second primary light, by means of which the phosphor layer is irradiatable, wherein the phosphor layer is configured for at least partly converting the first primary light into at least one first secondary light and for at least partly converting the second primary light into at least one second secondary light. The
(Continued)

light generating device is configured to dynamically illuminate the phosphor layer by means of the second primary light.

12 Claims, 2 Drawing Sheets

(51) Int. Cl.
*F21S 45/47* (2018.01)
*F21S 41/16* (2018.01)
*F21S 41/675* (2018.01)
*F21S 41/657* (2018.01)
*H01L 33/50* (2010.01)

(52) U.S. Cl.
CPC ........... *F21S 41/657* (2018.01); *F21S 41/675* (2018.01); *F21S 45/47* (2018.01); *H01L 33/504* (2013.01)

(56) References Cited

U.S. PATENT DOCUMENTS

| 2013/0193873 A1* | 8/2013 | Isaacson | H05B 33/0857 |
| | | | 315/294 |
| 2014/0340869 A1 | 11/2014 | Wang et al. | |
| 2014/0355240 A1 | 12/2014 | Farchtchian | |
| 2015/0176811 A1 | 6/2015 | Schwaiger et al. | |
| 2015/0369440 A1* | 12/2015 | Reinprecht | F21S 41/147 |
| | | | 362/510 |
| 2015/0375672 A1* | 12/2015 | Takahashi | G02B 6/0068 |
| | | | 701/49 |
| 2016/0146419 A1 | 5/2016 | Reinprecht | |

FOREIGN PATENT DOCUMENTS

| EP | 2487407 A2 | 8/2012 | |
| WO | WO-2014121314 A1 * | 8/2014 | ........... F21S 41/147 |
| WO | 2014205466 A1 | 12/2014 | |

* cited by examiner

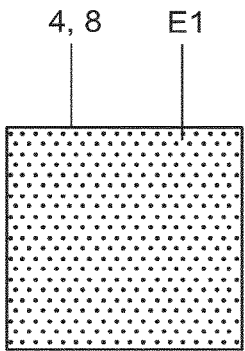 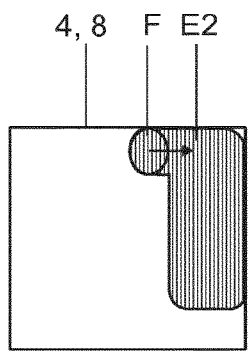 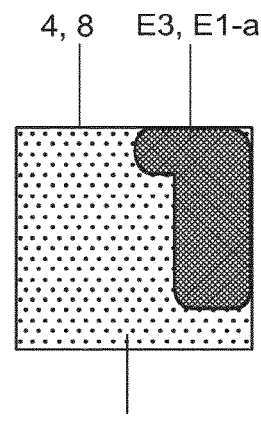
Fig. 2  Fig. 3  Fig. 4
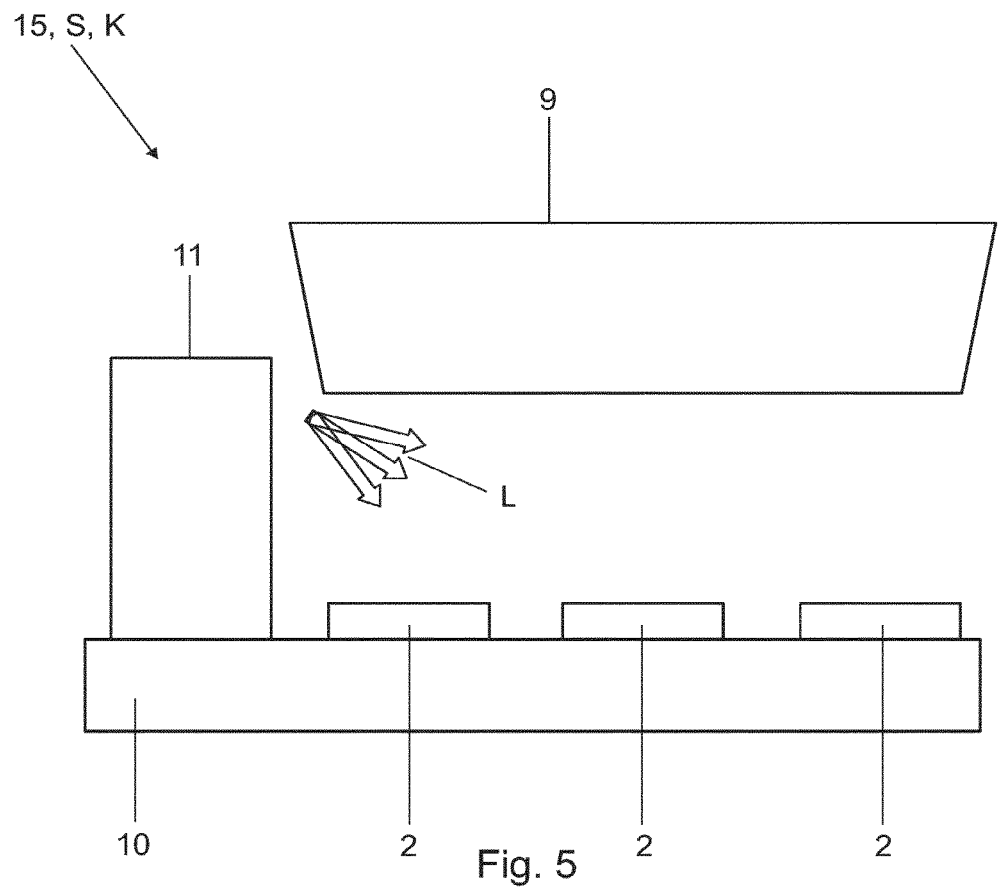
Fig. 5

LIGHT GENERATION WITH LIGHT EMITTING DIODE AND LASER

CROSS-REFERENCE TO RELATED APPLICATION

The present application is a national stage entry according to 35 U.S.C. § 371 of PCT application No.: PCT/EP2016/076559 filed on Nov. 3, 2016, which claims priority from German Patent Application Serial No.: 10 2015 224 692.2 which was filed Dec. 9, 2015, and is incorporated herein by reference in its entirety and for all purposes.

SUMMARY

The description relates to a light generating device, including at least one light emitting diode having a semiconductor layer that emits a first primary light, and having a phosphor layer arranged on the semiconductor layer, and including at least one laser for generating at least one laser beam composed of a second primary light, by means of which the phosphor layer is irradiatable, which phosphor layer is designed for at least partly converting the first primary light into at least one first secondary light and for at least partly converting the second primary light into at least one second secondary light. The description also relates to a headlight including at least one such light generating device. The description also relates to a vehicle including at least one such light generating device. The description furthermore relates to a method for emitting light from a phosphor layer of a light emitting diode, wherein a first side of the phosphor layer is irradiated by means of a first primary light, which is generated by a semiconductor layer that emits the first primary light, and simultaneously or sequentially a second side of the phosphor layer is irradiated in a scanning fashion by means of a second primary light emitted by at least one laser. The first side of the phosphor layer hereinafter is also referred to as the rear side of the phosphor layer, and the second side of the phosphor layer hereinafter is also referred to as the front side of the phosphor layer. The invention is usable in particular for vehicle lighting, stage lighting or effect lighting.

DE 10 2011 088 791 B3 discloses a lighting unit including a phosphor element, which is operated in transmission by means of a first pump light source and emits converted light at an emission surface. By means of a second pump light source, the phosphor element may be additionally illuminated at the emission surface, that is to say, operated in reflection, which increases the amount of converted light.

US 2014/0340869 A1 discloses a solid-state lighting system in which a light source module includes a first light source, including a light emitting diode and a phosphor layer, wherein the LED emits a wavelength in a first absorption band of the phosphor layer in order to generate a broadband light emission with longer wavelengths of the phosphor, and a second light source, which generates a laser emission with a second wavelength in the absorption band of the phosphor layer. During the operation of the LED, simultaneous laser pumping of the phosphor layer increases the light emission of the phosphor and thus brings about an emission with high brightness, e.g. in green, yellow or amber spectral ranges. Further modules, which provide emission at other wavelengths, e.g. in the UV and near UV spectral ranges, and also dichroic beam splitters/combiners enable an efficient, compact lighting system which achieves high brightness, suitable for fluorescence imaging and analysis.

A non-limiting object of the present description is to at least partly overcome the disadvantages of the prior art and in particular to provide a lighting device which makes it possible to generate a particularly versatile light distribution in conjunction with a long lifetime in a compact design.

This object may be achieved in accordance with the features of the independent claims. Non-limiting embodiments may be gathered in particular from the dependent claims.

The object may be achieved by means of a light generating device, including at least one light emitting diode having a semiconductor layer that emits a first primary light, and having a phosphor layer arranged on the semiconductor layer, and at least one laser for generating at least one laser beam composed of a second primary light, by means of which the phosphor layer is irradiatable, which phosphor layer is designed for at least partly converting the first primary light into at least one first secondary light and for at least partly converting the second primary light into at least one second secondary light, wherein the light generating device is configured to dynamically or temporally variably illuminate the phosphor layer by means of the second primary light.

In particular, the entire phosphor layer is irradiatable by the first primary light generated by the semiconductor layer, such that with the associated mixed light a comparatively large-area, homogeneous light emission is advantageously generatable by the phosphor layer. Moreover, this "LED operation" affords a high luminance (of the order of magnitude of approximately 100 cd/mm$^2$) at attractive costs and has a particularly long lifetime. By virtue of the fact that the phosphor layer is arranged on the semiconductor layer, it is irradiatable with the first primary light on the rear side, that is to say at its first side facing the semiconductor layer, said first side also being referred to as the rear side. By virtue of the temporally variable illumination with the second primary light, the light emission pattern emitted overall by the light generating device may also be considerably varied using simple means and with high speed or dynamic range. Light emission patterns that are particularly versatile and in particular also adapted to external events may thus be provided. By means of a hybrid use of the phosphor layer as a conversion layer of an LED and as a phosphor body for laser excitation, it is thus possible to combine the advantages of both types of excitation.

Since the phosphor layer is irradiated by the first primary light at its rear side and by the second primary light at its front side, corresponding heat is advantageously generated at different regions of the phosphor layer. This advantageously enables a higher total excitation power without the occurrence of saturation effects (e.g. a lower conversion efficiency on account of a higher temperature and/or excitation density) in the phosphor layer.

Moreover, the advantage is afforded that this light generating device is implementable in a particularly compact fashion. The light generating device may also be referred to as a hybrid light generating device or as a hybrid light source.

The light emitting diode may be present as an LED chip.

The light emitting diode may be a thin-film light emitting diode. The light emitting diode may be a flip-chip light emitting diode. The light emitting diode or its housing or package may be an SMD device.

The semiconductor layer may include one or in particular also a plurality of plies of semiconductor material, wherein at least two adjacent plies may consist of different semiconductor material. The semiconductor layer may thus also be designed as a semiconductor layer stack. The semiconductor plies may have been applied e.g. epitaxially ("epitaxial stack").

The semiconductor material has a high thermal conductivity of approximately 130/(m·K), for example. The light emitting diode may be arranged at a housing or package or at a printed circuit board, specifically more advantageously by means of a material having a low thermal resistance (e.g. by means of a TIM ["Thermal Interface"] material), by soldering or by sintering. The light emitting diode may be arranged for example at a leadframe or leadtrace or at a ceramic substrate.

The phosphor layer may also be referred to as a conversion layer. The phosphor layer may have been deposited on the emissive semiconductor layer or produced beforehand and then arranged on the semiconductor layer, e.g. adhesively bonded thereon.

By way of example, a ceramic phosphor element including a monocrystalline ceramic, a polycrystalline (single-phase or multi-phase) ceramic or a combination of monocrystalline phosphor elements with scattering layers may be used as the phosphor layer. The ceramic phosphor element may be present e.g. in the form of a lamella. It may be applied by adhesive bonding, in particular.

As material of the phosphor layer, it may also be possible to use a glass matrix filled with phosphor particles, the latter having been densified by temperature or by temperature and pressure.

As material of the phosphor layer, it may also be possible to use at least one phosphor powder that is held together by a binder matrix. The binder matrix may consist for example of: silicone; silicone, epoxy, acrylic, polyurethane hybrid materials; sol-gel binder systems, in particular on the basis of SiO2, or of siloxane(s) and/or silazane(s).

A deposited thin-film phosphor layer may also be used as the phosphor layer. The deposition may take place e.g. directly onto the chip or on an auxiliary carrier—for example composed of glass, sapphire, polycrystalline aluminum oxide (PCA), diamond, etc.

Generally, the phosphor layer may be mounted by means of suitable interface materials such as, for example, silicone or glass on a light emitting diode—designed in particular as an LED chip—as such. Alternatively, auxiliary carriers on which the phosphor layer has been applied may be mounted by means of suitable interface materials onto the light emitting diode as such. There is likewise the possibility of separating the phosphor layer by means of an air gap from the light emitting diode as such.

The first primary light may be, for example, blue light. The first primary light may be converted at least partly into yellow first secondary light for example by the phosphor layer, for example including a yellow yttrium aluminum garnet:cerium (YAG:Ce) phosphor. At the front-side surface of the phosphor layer facing away from the semiconductor layer, it is thereby possible to generate a mixed light made from the first primary light that passed through the phosphor layer without wavelength conversion and the first secondary light, e.g. a yellow-blue or white mixed light. Such a light emitting diode chip may be in particular a surface emitter. The first mixed light thus generated may be provided in particular for applications in the automotive industry, for example as light source of a front headlight for low and high beam, and have a color locus that lies within the white field of the corresponding ECE standard.

The second—e.g. blue—primary light emitted by the laser is also at least partly converted by the phosphor layer, specifically into the second—e.g. yellow—secondary light. At the front-side surface of the phosphor layer facing away from the semiconductor layer, it is thereby also possible to generate a mixed light made from the second primary light and the second secondary light, e.g. a yellow-blue or white mixed light.

Consequently, the first and the second primary light and also the first and the second secondary light may be emitted proportionally by the phosphor layer. This principle may be extended to further lasers having third, fourth, etc. primary light and to third, fourth, etc. secondary light.

The first mixed light and/or the second mixed light etc. may be provided in particular for applications in the automotive industry, for example as light source of a front headlight for low and high beam, and have a color locus that lies within a white field of the corresponding ECE standard.

In particular, the light generating device may be configured to illuminate the phosphor layer temporally and spatially variably by means of the second primary light. Consequently, the region or "luminous spot" illuminated by the second primary light at the front side of the phosphor layer may change its shape and/or its size and/or its position over time.

In particular, for this purpose, at least one movable mirror in particular for dynamically deflecting the associated laser beam may be arranged between the at least one laser and the phosphor layer irradiatable thereby.

In one development, at least one laser beam or the second primary light is movable over the phosphor layer in a scanning fashion. The phosphor layer is thus illuminatable in a scanning fashion by means of at least one laser beam. A "scanning" movement can be understood to mean in particular sweeping over the phosphor layer with a laser beam. As a result, a luminous spot generated by a specific laser beam on the front side of the phosphor layer is generatable at different points in time at different positions on the phosphor layer. By means of the laser beam that is movable relative to the phosphor layer, it is possible to excite (in addition or as an alternative to the LED illumination) dynamically variable regions—which are smaller in comparison with the total phosphor area—of the phosphor layer for generating the associated mixed light. For a high resolution, the luminous spot generated by the laser beam on the phosphor layer is advantageously much smaller than the area of the phosphor layer. The light emission from the phosphor layer generated in this case by the second primary light ("laser operation") enables locally still far higher peak luminances (with more than 1000 cd/mm$^2$) in conjunction with high spatial resolution and high contrast. Thus, in contrast to a static illumination with laser radiation, in conjunction with a simple construction, the scanning movement of the laser beam enables a particularly flexible variation of the light emission pattern, in particular also of a particularly high dynamic range. In one possible configuration thereof, at least one mirror scanner is arranged between the at least one laser and the phosphor layer irradiatable thereby. The mirror scanner includes at least one movable mirror for dynamically deflecting the associated laser beam on the phosphor layer. The at least one movable mirror may include at least one rotating mirror and/or at least one mirror that is resonantly movable back and forth. For two-dimensional deflection, by way of example, either one mirror can be deflected in two directions (e.g. by means of a microscanner), or two orthogonally rotatable standing mirrors are used, via which the laser beam is reflected. By means of the mirror scanner, it is possible to implement the movement or repositioning of the laser beam on the phosphor layer with a high spatial and temporal resolution with high efficiency.

In particular, in a scanning arrangement, it is possible to move the luminous spot on a predefined path on the phosphor layer. The path may be e.g. a linear or columnar path, a Lissajous figure or any other path. The path may be an open or closed path. The path may have one path section or may have a plurality of path sections separated from one another. A scan frequency can be e.g. 100 Hz to 2300 Hz or even higher still.

In another configuration, at least one surface light modulator is arranged between the at least one laser and the phosphor layer irradiatable thereby. The phosphor layer is thus dynamically illuminatable via a surface light modulator. In this case, individual partial regions of a beam cross section of the at least one laser beam may be selectively blocked by the surface modulator.

In one development thereof, at least one surface light modulator is a reflective surface modulator, e.g. a micromirror array. The micromirror array includes many moveable mirrors for dynamically deflecting the associated laser beam, specifically in particular optionally as useful light to a predefined position on the phosphor layer or as unused light to an absorption body. In an arrangement including the micromirror array, a laser beam incident thereon over part of the area or over the whole area may thus be modulated by the adjustable position of the micromirrors and be reflected onto provided regions of the phosphor layer. As a result, on the one hand a static surface illumination is generatable, but on the other hand a temporally and spatially dynamically varying light distribution is also adjustable. Moreover, a static light distribution may be realized over a predefined time period, for example if a bright point of light is intended to be generated by an approximately central irradiation of the surface of the phosphor layer, which point of light serves e.g. as high beam or additional high beam and is intended to be spatially unchanged and/or temporally unchanged in power density for a predefined time duration (e.g. of the order of magnitude of seconds or minutes) and thus constitutes a special case of dynamic lighting. If the intention is to provide just a spatially static and only temporally varying irradiation of the surface of the phosphor layer, it is sufficient to direct the laser beam onto the provided surface region by means of a stationary optical unit.

A reflective surface light modulator, in particular the micromirror array, may be understood to mean for example a digital mirror device (DMD) from Texas Instruments or a one- or two-dimensional MEMS (Micro-Electro-Mechanical System) or MOEMS (Micro-Opto-Electro-Mechanical System) or an LCoS (Liquid Crystal on Silicon) or similar technologies.

In principle, however, transmissive surface light modulators such as an LCD (Liquid Crystal Display) may also be used.

In another configuration, the at least one movable mirror constitutes part of a micromechanical system or MEMS system. Such a micromechanical system is particularly compact and insensitive.

In another configuration, a power of at least one laser beam is variable in order advantageously to achieve an even greater variation of the light emission pattern. This variation may be achieved e.g. by setting an amplitude of an operating signal for operating the at least one laser and/or by varying a pulse width in the case of a laser operated in a clocked fashion. In particular, at least one laser beam or the associated second primary light may be dimmed. In this configuration, the illumination of the phosphor layer may be spatially fixed or spatially dynamic. In particular, the temporal variation of the laser power may be combined with a spatial variation of the luminous spot generated by the second primary radiation, but need not be so combined. Consequently, this configuration also encompasses the fact that a laser beam fixedly directed onto the front side of the phosphor layer is variable only with regard to its power or brightness.

In a further configuration, at least one laser beam is movable over a plurality of light emitting diodes. In this regard, a particularly large-area, high-resolution light emission pattern may be provided using structurally simple means. Moreover, component parts may thus be saved.

In one development, the plurality of light emitting diodes include respective phosphor layers because such a development may be constructed particularly cost-effectively with individual light emitting diodes produced as standard.

In another development, a plurality of light emitting diodes include a common phosphor layer. As a result, it is possible to avoid gaps in the transition of the light emitting diodes as such and hence also unilluminated or more weakly illuminated stripes in the light emission pattern.

In yet another configuration, the light generating device includes a plurality of individually drivable light emitting diodes. This affords the advantage that the light emission pattern may thus also be spatially resolved at the LED level—in particular in a pixel-like fashion. In this regard, it is possible, if appropriate, to dispense with the activation of a laser for specific light emission patterns. To that end, a plurality of light emitting diodes may be arranged in particular in matrix form. In this case, in particular, the light emitting diodes may be LED chips. Alternatively or additionally, it is possible to use at least one light emitting diode which includes a plurality of individually drivable, in particular individually activatable luminous segments.

In one configuration, furthermore, the first primary light and the second primary light have a different wavelength. The particularly large selection of lasers may be used as a result. Moreover, an efficiency may thus be kept particularly high. By way of example, the wavelength of the first primary light may be 442 nm or 447 nm. By way of example, the wavelength of the second primary light may be 440 nm or 405 nm.

Alternatively, the first primary light and the second primary light may have an identical wavelength.

In one configuration, moreover, the first secondary light and the second secondary light have a different wavelength. A particularly efficient wavelength conversion may be made possible as a result. By way of example, the phosphor layer may be a mixture of a first phosphor, which converts the first primary light into the first secondary light particularly efficiently, and a second phosphor, which converts the second primary light into the second secondary light particularly efficiently.

In one development, the first secondary light and the second secondary light have an identical wavelength. This affords the advantage that a common phosphor that is excitable both by the first and by the second primary light may be used, as a result of which the phosphor layer is producible more simply.

Moreover, in one configuration, the phosphor layer of at least one light emitting diode optionally is irradiatable simultaneously by the first primary light and the second primary light or is irradiatable only by the first primary light or the second primary light. The phosphor layer may thus be irradiatable by the first primary light and/or by the second primary light. In this regard, advantageously it is possible to achieve an even greater flexibility in the generation of the light emission pattern.

In one development, the phosphor layer is irradiatable sequentially or alternately by the first primary light and by the second primary light. This may reduce even further a loading of the light emitting diode. In order to achieve a superimposed representation of the associated light patterns for the human eye even in the case of a large area to be irradiated, an illumination frequency may be in particular at least 25 Hz, in particular at least 50 Hz, in particular at least 100 Hz, in particular at least 200 Hz, in particular at least 300 Hz, in particular at least 400 Hz. In this case, the illumination frequency may indicate how many individual illuminations of the phosphor layer with the first primary light and the second primary light or how many illuminations of the phosphor layer with a pair including the first primary light and the second primary light may be carried out per second. In this regard, an illumination frequency of 100 Hz may mean that the phosphor area has been illuminated alternately 50 times by the first primary light and 50 times by the second primary light in one second.

The light generating device may thus be operated, in principle, in three different fundamental operating modes, or modes:

Firstly, the phosphor layer of at least one light emitting diode may be irradiated only with the first primary light ("LED operation"). The (pure) LED operation may provide a particularly large-area and uniform light emission pattern in conjunction with little loading of the light emitting diode. The LED operation supports a particularly long lifetime and is cost-effective.

If a plurality of individually drivable light emitting diodes or LED segments are used in this case, by means of a respective activation or deactivation of the light emitting diodes it is also possible to achieve an adaptation of a form of the light emission pattern, but with a lower resolution than in the case of illumination with a laser beam. This may be advantageous even with a small number of light emitting diodes (e.g. of five or fewer).

Secondly, the phosphor layer of at least one light emitting diode may be irradiated only with the second primary light ("laser operation"). The (pure) laser operation may provide an individually adapted light emission pattern with high spatial resolution, high contrast and high luminance.

Thirdly, the phosphor layer of at least one light emitting diode may be irradiated with the first primary light and simultaneously with the second primary light ("hybrid operation"). In this case, part of the front side or even the entire front side of the phosphor layer may be irradiated with the laser light or the second primary light.

In principle, the phosphor layer may also be irradiated with light that is not converted by the phosphor layer. The phosphor layer may serve e.g. as a scattering volume or as a diffuse reflector for such light. The irradiation with such light has the advantage that further color components may be admixed with the emitted mixed light, e.g. for changing the light color or the color locus of the light emitted overall.

Moreover, in one configuration, the semiconductor layer, at its side facing away from the phosphor layer, includes a reflection surface for the light emitted by the semiconductor layer. An increased efficiency or luminous efficiency is achieved as a result. By means of the reflection surface, not just the first primary light emitted rearward by the semiconductor layer but also light and/or second primary light emitted rearward by the phosphor layer may be reflected back (i.e. toward the front again).

In the case of thin-film LED chips, for example, the reflection surface may be formed as a reflection surface (also referred to as "rear-side mirror")—arranged in direct proximity to the semiconductor layer—of the associated LED chip.

Alternatively, by way of example, an LED chip including a thin sapphire substrate may be mounted on a highly reflective substrate, and be covered by a phosphor layer. The highly reflective substrate thus provides the reflection surface.

In another configuration, moreover, the laser beam is configurable such that an extent of a luminous spot generated on the phosphor layer by a laser beam measures not more than 50% of a corresponding extent of the phosphor layer.

As a result, it is possible to achieve a particularly high resolution of the second mixed light on the phosphor area. The resolution may also be increased by the laser beam being configurable such that an extent of a luminous spot generated on the phosphor layer by a laser beam measures not more than 40%, in particular not more than 30%, in particular not more than 20%, in particular not more than 10%, in particular not more than 5%, of a corresponding extent of the phosphor layer.

The shape of the luminous spot may be e.g. round or oval. In particular, a diameter of the luminous spot may have an extent which corresponds to not more than 50%, in particular not more than 20%, in particular not more than 10%, in particular not more than 5%, of an edge length of the phosphor layer.

The shape and/or a size of the luminous spot may be fixed or variable. In the case of a variable shape and/or size of the luminous spot, at least one beam shaping optical unit, e.g. at least one lens, may be present e.g. between the associated at least one laser and the phosphor layer.

The at least one laser may be arranged on the same substrate or leadframe as the at least one light emitting diode.

The object may also be achieved by means of a headlight, including at least one light generating device as described above. The headlight/spotlight may be designed analogously to the light generating device and affords the same advantages.

In this regard, the headlight/spotlight may be operated in three fundamental operating modes:

In pure LED operation, the headlight may be used for example to illuminate regions in front of a vehicle over a large area and uniformly, e.g. as a low beam. The pure LED operation may be used, for example, if there is no risk of dazzling other road users (oncoming vehicles, pedestrians, etc.) or animals.

In pure laser operation, the headlight may be used for example in a targeted manner to exclude regions in front of a vehicle from an illumination or to attenuate the illumination there, which regions would otherwise be dazzled, e.g. regions in which other road users are situated.

In hybrid operation, e.g. in addition to the light emission pattern generated by means of LED operation, partial regions with particularly high luminance may be added by laser operation, e.g. in order to generate a high beam or partial high beam and/or in order to generate a hazard light that is projected onto a hazard zone, situated on the road, for example. In this case, by way of example, a central or outer region of the phosphor layer could be illuminated in a scanning fashion by means of the highly intensive laser beam.

A further possibility of hybrid illumination of the phosphor layer may be e.g. a cornering light function. For this purpose, by way of example, a DLP surface light modulator may be disposed downstream of the light generating device, said modulator projecting the light generated by the light generating device onto the roadway directly or via a projection optical unit. The difficulty in implementing the cornering light function in pure LED operation is that, owing to the homogeneous illumination of the phosphor layer, the edge regions of the phosphor layer cannot be supplied with an even higher intensity. This would be necessary, however, in order to realize an intensive cornering light function by means of a DLP. A luminance and a brightness of the light emission pattern of the headlight must not decrease in the curve. In order to implement such a homogeneous and highly intensive illumination in the edge regions of the DLP with low costs, in routine operation the basic brightness generated by irradiation with the first primary light may be used and edge regions may be additionally illuminated by laser radiation in hybrid operation (in order to generate a locally high luminance) only as necessary (e.g. during cornering). A further advantage besides the low costs is the improved efficiency by comparison with pure laser systems. Light is generated only where it is required for the illumination of the current light emission pattern.

The headlight/spotlight may thus be used in particular in all three basic operating modes.

In one variant, the entire front side of the phosphor layer may be irradiated with the associated laser light or second primary light in order to generate a particularly bright and large-area light emission pattern.

The headlight/spotlight may include a coupling-out optical unit for coupling out the light generated by means of the at least one (in particular exactly one) light generating device, e.g. into a region in front of the vehicle. The coupling-out optical unit is designed in particular such that an initial position of an emitted light beam on the phosphor layer determines where said light beam is projected spatially. The coupling-out optical unit is advantageously the same for the first mixed light and for the second mixed light.

The headlight/spotlight may be a vehicle headlight, in particular for spatial illumination in front of the vehicle (front headlight). The vehicle may be a motor vehicle (automobile, truck, bus, motorcycle, construction site vehicle, etc.), a watercraft (ship, etc.) or an aircraft (airplane, helicopter, etc.). However, the headlight/spotlight may also be a spotlight for stage lighting, effect lighting, etc.

The headlight/spotlight enables in particular a particularly cost-effective and long-lived implementation of an AFS ("Adaptive Frontlighting System") headlight or of an ADB ("Automated Driving Beam") headlight.

The object is also achieved by means of a vehicle, including at least one light generating device as described above and/or at least one headlight as described above. The vehicle may be designed analogously to the light generating device and to the headlight and affords the same advantages.

The vehicle may be a motor vehicle (e.g. an automobile such as a car, truck, bus, etc. or a motorcycle), a train, a watercraft (e.g. a boat or a ship) or an aircraft (e.g. an airplane or a helicopter).

In one configuration, the vehicle includes at least one sensor and the vehicle is configured to dynamically illuminate the phosphor layer depending on at least one sensor measurement value. In this regard, a vehicle may change its light emission pattern in reaction to, in particular, external conditions. By way of example, the sensor may include a camera which is sensitive in the visible spectral range and/or in the infrared and/or in the ultraviolet spectral range and by means of which it is possible to carry out an image recognition in respect of specific objects such as other road users (vehicles and/or pedestrians, etc.) or animals. An image refresh frequency may be for example up to 400 Hz or even higher still, in order to be able to react to external influences particularly rapidly. In this case, the image recorded by the camera corresponds to the sensor measurement value. By way of example, the light emission pattern may then be varied such that the specific objects are no longer irradiated or are irradiated with a lower brightness. However, the sensor may e.g. also be a distance measuring device, a proximity sensor, a speed measuring device, etc., e.g. on the basis of radar, laser or lidar. In particular, the headlight may be used like an AFS or ADB headlight.

The object may additionally be achieved by means of a method for emitting light from a phosphor layer of a light emitting diode, wherein a first side of the phosphor layer is irradiated by means of a first primary light, which is generated by a semiconductor layer that emits the first primary light, and simultaneously a second side of the phosphor layer is irradiated in a scanning fashion by means of a second primary light emitted by at least one laser.

The method may be designed analogously to the devices described above and affords the same advantages.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which:

FIG. 2 shows, in plan view, a phosphor layer of a light emitting diode of the light generating device from FIG. 1 in LED operation;

FIG. 3 shows, in plan view, the phosphor layer of the light emitting diode of the light generating device from FIG. 1 in laser operation;

FIG. 4 shows, in plan view, the phosphor layer of the light emitting diode of the light generating device from FIG. 1 in hybrid operation; and FIG. 5 shows, as a sectional illustration in side view, a schematic diagram of a light generating device in accordance with a second exemplary embodiment as part of a headlight/spotlight.

DETAILED DESCRIPTION

Figure 1:
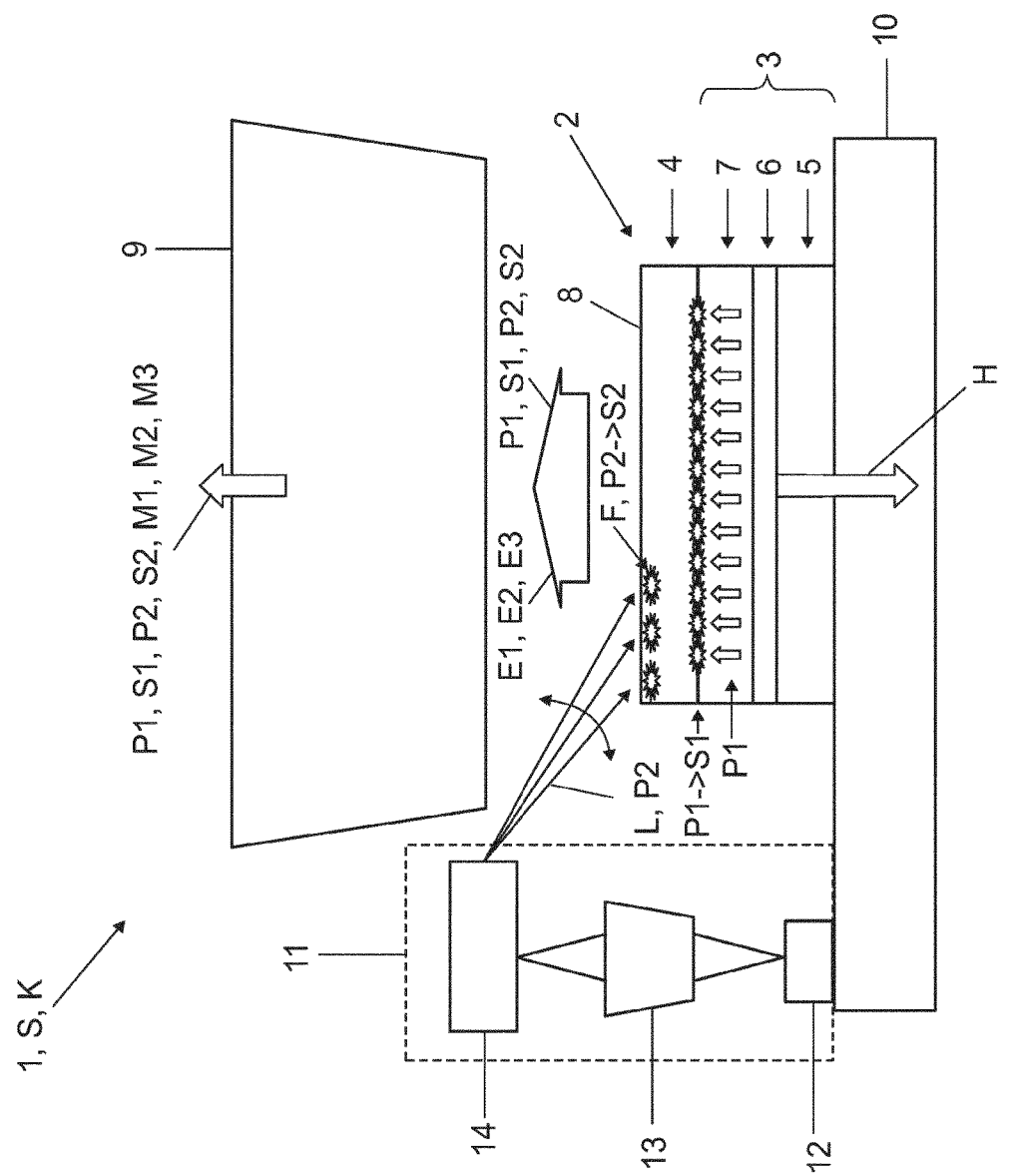
FIG. 1 shows, as a sectional illustration in side view, a schematic diagram of a light generating device in accordance with a first exemplary embodiment as part of a headlight/spotlight.

The word "exemplary" is used herein to mean "serving as an example, instance, or illustration". Any embodiment or design described herein as "exemplary" is not necessarily to be construed as preferred or advantageous over other embodiments or designs.

FIG. 1 shows, as a sectional illustration in side view, a schematic diagram of a light generating device 1, which may form e.g. part of a headlight S of a car K. The light generating device 1 includes a light emitting diode 2, which includes a thin-film LED 3 with a phosphor layer 4 applied thereon. The thin-film LED 3 includes a substrate layer 5, a reflective layer 6 ("rear-side mirror") arranged thereon, and a semiconductor layer 7 arranged on the reflective layer 6.

The semiconductor layer 7 is designed as a semiconductor layer stack and emits first primary light P1 having a first primary light wavelength, e.g. blue light. The first primary light P1 is radiated partly areally, such that it illuminates a rear side—facing the semiconductor layer 7—of the phosphor layer 4 uniformly and over the whole area. First primary light P1 emitted in the direction of the substrate layer 5 is reflected back from the reflective layer 6 arranged on the substrate layer 5 and then likewise passes at least partly to the phosphor layer 4 or to the rear side of the phosphor layer 4.

At the phosphor layer 4, the first primary light P1 is partly converted into secondary light S1 having a first secondary light wavelength ("P1→S1"). The first secondary light S1 may be e.g. yellow light. The first secondary light S1 is emitted together with the non-converted portion of the first primary light P1 as first mixed light P1, S1 (e.g. as white mixed light) from a front side 8 of the phosphor layer 4 facing away from the semiconductor layer 7. The mixed light P1, S1 passes to a coupling-out optical unit 9, which couples out the mixed light P1, S1 from the light generating device 1 or from the headlight/spotlight S, e.g. into a region in front of a vehicle or onto a stage.

The light emitting diode 2 bears by its substrate layer 5 on a printed circuit board 10 or a leadframe of a package, to which heat H generated at the light emitting diode 2 is also emitted.

The light generating device 1 furthermore includes a laser illumination unit 11 for emitting at least one laser beam L composed of second primary light P2. To that end, the laser illumination unit 11 includes one or more lasers 12 (e.g. laser diodes) that radiate the second primary light P2 emitted thereby through a collimation optical unit 13 onto a MEMS scanning system ("MEMS mirror scanner"), which for this purpose includes at least one movable deflection mirror (not illustrated) for dynamically deflecting the at least one laser beam L. The MEMS scanning system 14 is designed to direct the at least one incident laser beam L or the incident second primary light P2 onto the front side 8 of the phosphor layer 4 in a scanning fashion, thus resulting there in a luminous spot F of the second primary light P2, said luminous spot moving over the front side 8. In this case, an extent of the luminous spot F is significantly smaller than a planar extent of the phosphor layer 4, e.g. only 10% of the size thereof in one direction. The position of the luminous spot F at the front side 8 of the phosphor layer 4 may thus be varied over time. In particular, the luminous spot F may trace a path on the surface at the front side 8 of the phosphor layer 4. At the location of the luminous spot F, the second primary light P2 is partly converted into second secondary light S2 ("P2→S2"). The second secondary light S2 may be e.g. yellow light. The second secondary light S2 is emitted together with the non-converted portion of the second primary light P2 as second mixed light P2, S2 (e.g. as white mixed light) from the front side 8 of the phosphor layer 4. The second mixed light P2, S2 then likewise passes to the coupling-out optical unit 9, which also couples out the second mixed light P2, S2 from the light generating device 1 or from the headlight/spotlight S. By using the same coupling-out optical unit 9 for the mixed light P1, S1 and the mixed light P2, S2 it is possible to save costs and structural space.

The collimation optical unit 13 may be fixedly or variably settable. The variable settability of the collimation optical unit 13 may serve for example for beam shaping, e.g. for setting a size and/or shape of a beam cross section of the laser beam L and thus also of the luminous spot F.

If there is a gap between the light emitting diode 2 and the coupling-out optical unit 9, the at least one laser beam L may be radiated through said gap onto the phosphor layer 4, if appropriate at an oblique angle of incidence with respect to a normal vector of the surface 8. Alternatively, the at least one laser beam L may be radiated through the coupling-out optical unit 9 onto the phosphor layer 4 (not illustrated). Particularly if the coupling-out optical unit 9 has a reflector (not illustrated), the at least one laser beam L may be radiated through a hole in the reflector onto the phosphor layer 4. Said hole may be kept small on account of the small beam diameter of the laser beam L.

Overall, the first mixed light P1, S1 and/or the second mixed light P2, S2 generate(s) a light emission pattern E1, E2 or E3 at the front side 8 of the phosphor layer 4, said light emission pattern being converted, by means of the coupling-out optical unit 9, into a corresponding light emission pattern M1, M2 or M3 emitted by the headlight/spotlight.

The first primary light P1 and the second primary light P2 may have an identical or a different wavelength. The first secondary light S1 and the second secondary light S2 may have an identical or a different wavelength.

The laser illumination unit 11 is arranged on the same printed circuit board 10 as the light emitting diode 2.

FIG. 2 shows, in plan view, the phosphor layer 4 of the light emitting diode 2 in an operating mode of pure LED operation, wherein the phosphor layer 4 is irradiated only by the first primary light P1. As a result, a homogeneous, whole-area light emission pattern E1 is generated at the surface of the phosphor layer 4. Consequently, a large-area light emission pattern M1 emitted by the headlight/spotlight S is also generated, e.g. for implementing a low beam.

FIG. 3 shows, in plan view, the phosphor layer 4 of the light emitting diode 2 in an operating mode of pure laser operation, wherein the phosphor layer 4 is irradiated only by the laser beam L or the second primary light P2. To that end, by means of the MEMS scanning system 14, the luminous spot F is moved at the front side 8 on the surface of the phosphor layer 4 or "scanned" on the surface, as indicated by the arrow, until the desired light emission pattern E2 has been generated. The phosphor layer 4 is not luminous outside the light emission pattern E2. The light emission pattern E2 generated in pure laser operation has locally a far higher luminance than the light emission pattern E1 and may be generated with high resolution and high contrast. In this case, in principle, an arbitrary, including multipartite, shape of the light emission pattern E2 is generatable.

FIG. 4 shows, in plan view, the phosphor layer 4 of the light emitting diode 2 in a hybrid operating mode, wherein the phosphor layer 4 is irradiated both by the first primary light P1 and—at least partly—simultaneously by the laser beam L or the second primary light P2. The resulting light emission pattern E3 is here for example a superimposition of the light emission patterns E1 and E2 (that is to say that E3=E1+E2 holds true). As a result, a particularly high luminance may be achieved in a region E1-*a* that is irradiated by the first primary light P1 and by the second primary light P2, while the remaining region E1-*b* is irradiated only by the first primary light P1 and provides a "basic brightness" layer.

The phosphor layer 4 may be operated optionally in one of the operating modes. The operating modes may alternate sequentially over time.

Generally, the intensity or brightness of the at least one laser beam L may be varied (e.g. dimmed) in order to achieve an even greater variation of the light emission pattern E2 or E3 and/or M2 and M3. Said variation may be achieved e.g. by setting an amplitude of an operating signal for operating the at least one laser 12 and/or by varying a pulse width in the case of a laser 12 operated in a clocked fashion.

FIG. 5 shows a light generating device 15, e.g. of a headlight/spotlight S, wherein the at least one laser beam L is movable over a plurality of light emitting diodes 2 or the phosphor layers 4 thereof. In this regard, it is possible to achieve a particularly large-area light emission pattern from an addition of the light emission patterns E1, E2 or E3 of the plurality of light emitting diodes 2. The light emitting diodes 2 may be operated independently of one another in the respective operating modes, e.g. one light emitting diode 2 in pure LED operation, one light emitting diode 2 in pure laser operation and one light emitting diode 2 in hybrid operation.

A common secondary optical unit 9 is disposed downstream of the light emitting diodes 2. Alternatively or additionally, a respective secondary optical unit may be disposed downstream of the light emitting diodes 2.

Generally, the light emitting diodes 2 may be individually drivable, e.g. individually generate the first primary light E1 independently of the other light emitting diodes 2.

Although the invention has been more specifically illustrated and described in detail by means of the exemplary embodiments shown, nevertheless the invention is not restricted thereto and other variations may be derived therefrom by the person skilled in the art, without departing from the scope of protection of the invention.

In this regard, in another variant, provision may be made of a plurality of light emitting diodes 2 with respectively associated laser illumination units 11. In this case, too, a common secondary optical unit 9 may be disposed downstream of the light emitting diodes 2, or a respective secondary optical unit may be disposed downstream of the light emitting diodes 2.

Generally, "a(an)", "one", etc. may be understood to mean a singular or a plural, in particular in the sense of "at least one" or "one or a plurality", etc., as long as this is not explicitly excluded, e.g. by the expression "exactly one", etc.

Moreover, a numerical indication may encompass exactly the indicated number and also a customary tolerance range, as long as this is not explicitly excluded.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SIGNS

1 Light generating device
2 Light emitting diode
3 Thin-film LED
4 Phosphor layer
5 Substrate layer
6 Reflective layer
7 Semiconductor layer
8 Front side of the phosphor layer
9 Secondary optical unit
10 Printed circuit board
11 Laser illumination unit
12 Laser
13 Collimation optical unit
14 MEMS scanning system
15 Light generating device
E1-E3 Light emission patterns
F Luminous spot
K Car
L Laser beam
M1-M3 Light emission patterns
P1 First primary light
P2 Second primary light
S Headlight/spotlight
S1 First secondary light
S2 Second secondary light

The invention claimed is:

1. A light generating device, comprising:
   at least one light emitting diode having:
      a semiconductor layer that emits a first primary light,
      a phosphor layer applied directly to a first surface of the semiconductor layer, and
      a reflector layer applied to a second surface of the semiconductor layer opposite to the first surface of the semiconductor layer, wherein the semiconductor layer, the phosphor layer, and the reflector layer collectively form a thin-film light emitting diode; and
   at least one laser for generating at least one laser beam composed of a second primary light, such that the phosphor layer is irradiatable,
   wherein the phosphor layer is configured for at least partly converting the first primary light into at least one first secondary light and for at least partly converting the second primary light into at least one second secondary light,
   wherein the light generating device is configured to dynamically illuminate the phosphor layer by means of the second primary light.

2. The light generating device as claimed in claim 1, wherein at least one mirror scanner is arranged between the at least one laser and the phosphor layer irradiatable thereby.

3. The light generating device as claimed in claim 1, wherein at least one surface light modulator is arranged between the at least one laser and the phosphor layer irradiatable thereby.

4. The light generating device as claimed in claim 1, wherein a power of at least one laser beam is variable.

5. The light generating device as claimed in claim 1, wherein a plurality of light emitting diodes are jointly dynamically illuminatable by means of at least one laser beam.

6. The light generating device as claimed in claim 1, wherein the light generating device comprises a plurality of individually drivable light emitting diodes.

7. The light generating device as claimed in claim 1, wherein the first secondary light and the second secondary light have a different wavelength.

8. The light generating device as claimed in claim 1, wherein the phosphor layer of at least one light emitting diode is irradiatable simultaneously by the first primary light and the second primary light or is irradiatable only by the first primary light or the second primary light.

9. The light generating device as claimed in claim 1, wherein the laser beam is configurable such that an extent of a luminous spot generated on the phosphor layer by a laser beam measures not more than 50% of a corresponding extent of the phosphor layer.

10. A headlight, comprising at least one light generating device as claimed in claim 1.

11. The light generating device of claim 1, wherein the at least one light emitting diode and the at least one laser are arranged together on a circuit board.

12. The light generating device of claim 1, wherein the at least one light emitting diode includes a plurality of individually drivable luminous segments.

\* \* \* \* \*